United States Patent
Chang et al.

(10) Patent No.: US 9,847,478 B2
(45) Date of Patent: Dec. 19, 2017

(54) METHODS AND APPARATUS FOR RESISTIVE RANDOM ACCESS MEMORY (RRAM)

(75) Inventors: Ting-Chang Chang, Kaohsiung (TW); Yong-En Syu, Tainan (TW); Fu-Yen Jian, Kaohsiung (TW); Shih-Chieh Chang, Taipei (TW); Ying-Lang Wang, Tien-Chung Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/416,183

(22) Filed: Mar. 9, 2012

(65) Prior Publication Data
US 2013/0234094 A1  Sep. 12, 2013

(51) Int. Cl.
*H01L 45/00* (2006.01)
*H01L 27/24* (2006.01)

(52) U.S. Cl.
CPC .......... *H01L 45/04* (2013.01); *H01L 27/2436* (2013.01); *H01L 45/12* (2013.01); *H01L 45/145* (2013.01); *H01L 45/1608* (2013.01)

(58) Field of Classification Search
CPC .............................. H01L 45/04; H01L 45/145
USPC .......................... 257/2, 3, E45.002, E45.003
See application file for complete search history.

(56) References Cited

U.S. PATENT DOCUMENTS

| | | | |
|---|---|---|---|
| 2008/0048164 A1* | 2/2008 | Odagawa | G11C 13/0007 257/2 |
| 2008/0142984 A1* | 6/2008 | Chen | H01L 45/06 257/773 |
| 2009/0212272 A1* | 8/2009 | Breitwisch et al. | 257/3 |
| 2010/0328996 A1* | 12/2010 | Shi | H01L 45/06 365/163 |

FOREIGN PATENT DOCUMENTS

| | | |
|---|---|---|
| TW | 1311376 B | 6/2009 |
| TW | 1318437 B | 12/2009 |
| TW | 1329356 B | 8/2010 |
| TW | 1344150 B | 6/2011 |

* cited by examiner

*Primary Examiner* — Amar Movva
(74) *Attorney, Agent, or Firm* — Slater Matsil, LLP

(57) ABSTRACT

Methods and apparatuses for a resistive random access memory (RRAM) device are disclosed. The RRAM device comprises a bottom electrode, a resistive switching layer disposed on the bottom electrode, and a top electrode disposed on the resistive switching layer. The resistive switching layer is made of a composite of a metal, Si, and O. There may be an additional tunnel barrier layer between the top electrode and the bottom electrode. The top electrode and the bottom electrode may comprise multiple sub-layers.

20 Claims, 1 Drawing Sheet

METHODS AND APPARATUS FOR RESISTIVE RANDOM ACCESS MEMORY (RRAM)

BACKGROUND

Memory devices are used to store information in semiconductor devices and systems. The popular dynamic random access memory (DRAM) cell includes a switch and a capacitor. DRAMs are highly integrated and fast memory devices, but they do not retain data when power is cut off.

On the other hand, a nonvolatile memory device is capable of retaining data even after power is cut off. Examples of nonvolatile memory devices include the flash memory, magnetic random access memories (MRAMs), ferroelectric random access memories (FRAMs) and phase-change random access memories (PRAMs). MRAMs store data using variations in the magnetization direction at tunnel junctions. FRAMs store data using polarization characteristics of ferroelectricity. PRAMs store data using resistance variations caused by phase changes of specific materials.

The ideal semiconductor memory includes random accessibility, non-volatile characteristics, increased capacity, increased speed, reduced power consumption, and unlimited reading and writing functions. Resistive Random Access Memory (RRAM) technology has been gradually recognized as having exhibited those semiconductor memory advantages.

RRAM cells are non-volatile memory cells that store information by changes in electric resistance, not by changes in charge capacity. In general, an RRAM cell includes a storage node in which a bottom electrode, a resistive switching layer and a top electrode may be sequentially stacked. The resistance of the resistive switching layer varies according to an applied voltage. An RRAM cell can be in a plurality of states in which the electric resistances are different. Each different state may represent a digital information. The state can be changed by applying a predetermined voltage or current between the electrodes. A state is maintained as long as a predetermined operation is not performed. The manufacturing process and the stability of the RRAM operations are issues needing to be improved for RRAM technology.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be illustrated in the following, methods and apparatus for Resistive Random Access Memory (RRAM) cells are disclosed. The RRAM cell comprises a resistive switching layer made of a composite of metal, Si, and O, which improves the stability of the resistance. Furthermore, the so-formed RRAM cell can be manufactured in a same process as the normal semiconductor device process.

Figure 1:
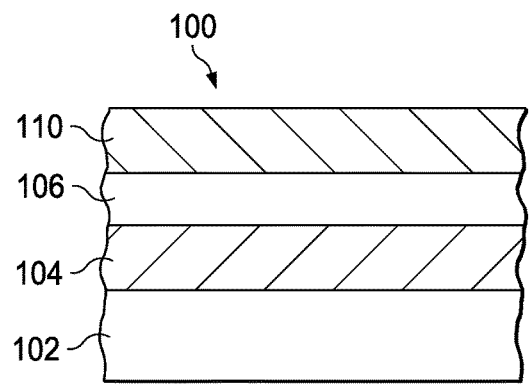
FIGS. 1-4 illustrate a cross-sectional view of various RRAM cells comprising a bottom electrode, a resistive switching layer, and a top electrode, formed on top of a substrate.

FIG. 1 illustrates an exemplary cross-section of an RRAM cell. An RRAM cell 100 is formed on a substrate 102. The RRAM cell 100 includes a lower electrode 104, which is a first electrode or a bottom electrode, a resistive switching layer 106, and an upper electrode 110, which is a second electrode or a top electrode. The RRAM cell 100 may have two or more states with different electric resistance values. Each state may represent a different digital value. The RRAM cell 100 may switch from one state to another by applying a predetermined voltage or current to the RRAM cell 100. For example, the RRAM cell 100 has a state of relatively high resistance, referred to as "a high resistance state", and a state of relatively low resistance, referred to as "a low resistance state". The RRAM cell 100 may be switched from the high resistance state to the low resistance state, or from the low resistance state to high resistance state by applying a predetermined voltage or current.

The substrate 102 may be a substrate employed in a semiconductor process, such as a silicon substrate. The substrate 102 may comprise a complementary metal oxide semiconductor (CMOS) circuit, an isolation structure, a diode, or a capacitor. FIG. 1 illustrates the substrate 102 in a plain rectangle in order to simplify the illustration, and is not limiting. There may be other shapes and sizes of substrate 102.

A bottom electrode 104 may be formed on the substrate 102. The bottom electrode 104 can be electrically connected to a drain electrode of a transistor (not shown). The bottom electrode 104 can further include a barrier layer formed thereon. The bottom electrode 104 may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the bottom electrode 104 may be between a range about 5-500 nm.

A resistive switching layer 106 may be formed on the bottom electrode 104 and directly contacts to the bottom electrode 104. The material for the resistive switching layer may be a composite of metal, Si, and O. The method for forming the resistive switching layer may be selected from a group consisting essentially of oxidation of metal silicide, co-deposition of metal, silicon in oxygen ambiance, co-deposition of metal oxide and silicon, or co-deposition of metal oxide and silicon oxide. The thickness of the resistive switching layer 106 may be between a range about 1-100 nm. The metal in the resistive switching layer may comprise W, Ta, Ti, Ni, Co, Hf, Ru, Zr, Zn, Fe, Sn, Al, Cu, Ag, Mo, Cr, or combinations thereof.

A top electrode 110 may be formed on the resistive switching layer 106. The top electrode 110 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the top electrode 110 may be between a range about 5-500 nm.

Figure 2:
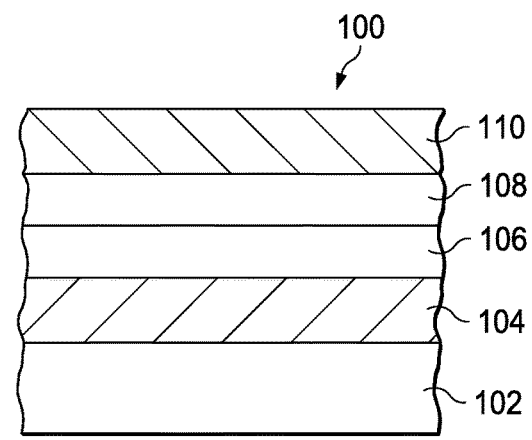

As illustrated in FIG. 2, an RRAM cell may further have a tunnel barrier layer 108 formed. Other layers of FIG. 2, such as the layer 102, 104, 106, and 110 are essentially the same as the layers in FIG. 1. The tunnel barrier layer 108 may be disposed between the resistive switching layer 106 and the top electrode 110 as shown in FIG. 2. The tunnel barrier layer 108 also may be disposed between the bottom electrode 104 and the resistive switching layer 106, not shown. The tunnel barrier layer 108 is formed from insulating material. The tunnel barrier layer 108 may be formed from aluminum oxide ($Al_2O_3$), silicon oxide ($SiO_2$), magnesium oxide (MgO), titanium oxide ($TiO_2$), titanium aluminum oxynitride (TiAlON), tantalum oxide ($TaO_2$), tantalum aluminum oxynitride (TaAlON), silicon nitride (SiN) and silicon oxynitride (SiON), for example. The tunnel barrier layer 108 may be as thin as 0.5 nm or in a range about 0.5-50 nm. The tunnel barrier layer 108 may be formed from insulating material other than transition metal oxide, such as an oxide of a metal element other than transition metal element.

Figure 3:
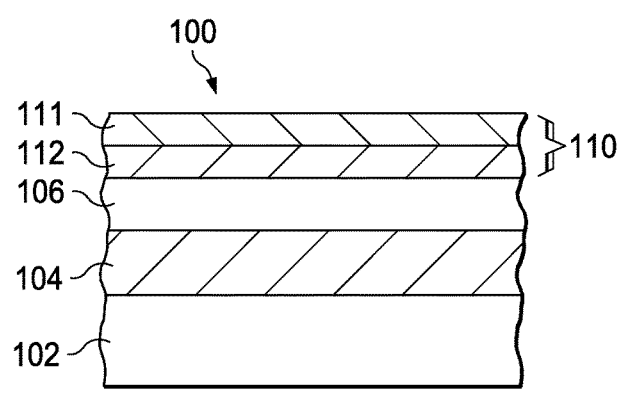

As illustrated in FIG. 3, an RRAM cell may further have the top electrode as a composite electrode including at least two metal layers such as a first top electrode sub-layer 111 and a second top electrode sub-layer 112 as shown in FIG. 3. Other layers of FIG. 3, such as the layer 102, 104, and 106, are essentially the same as the layers in FIG. 1. A tunnel barrier layer 108 may be formed in FIG. 3 as well, not shown. The two metal layers 111 and 112 may be made of different materials and respectively include TaN, TiN, TiAlN, TiW, Pt, W, Ru, or combinations thereof. The composite top electrode can prevent oxide atoms from further diffusing.

Figure 4:
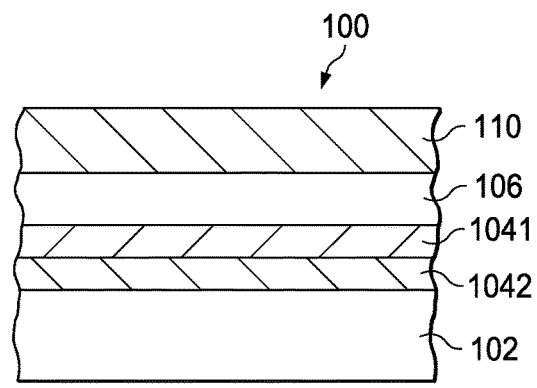

As illustrated in FIG. 4, an RRAM cell may further have the bottom electrode as a composite electrode including at least two metal layers such as a first bottom electrode sub-layer 1041 and a second bottom electrode sub-layer 1042 as shown in FIG. 4. Other layers of FIG. 4, such as the layer 102, 106, and 110 are essentially the same as the layers in FIG. 1. A tunnel barrier layer 108 may be formed in FIG. 4 as well, not shown. The two metal layers 1041 and 1042 may be made of different materials and respectively include TaN, TiN, TiAlN, TiW, Pt, W, Ru, or combinations thereof. The composite bottom electrode can prevent oxide atoms from further diffusing.

Various modifications may be made to any of the above RRAM cells. The RRAM cell may be provided in any orientation or axis, including vertical (as illustrated), horizontal, or angled. Further, the cross-section of the RRAM cell layers may be provided of any shape desired, including rectangular, other polygon, or elliptical. The RRAM cell layers may be of different shapes or structures. Depending on the composition of the various layers and etches used, the order in which certain layers are placed or deposited can be varied. It will also be recognized that the order of layers and the materials forming those layers in the above embodiments are merely exemplary. Moreover, in some embodiments, other layers (not shown) may be placed or deposited and processed to form portions of an RRAM cell or to form other structures on the substrate. In other embodiments, these layers may be formed using alternative deposition, patterning, and etching materials and processes, may be placed or deposited in a different order, or composed of different materials, as would be known to one of skill in the art.

Further, the RRAM cell may be provided in any electronic device for storing data. The RRAM cell may be provided in RRAM circuit to store data, where such data can be stored, read from, and/or written into the RRAM cell. The RRAM cell according to embodiments disclosed herein may be included or integrated in a semiconductor die and/or in any other device, including an electronic device. Examples of such devices include, without limitation, a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of ordinary skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Overall, the description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A resistive random access memory (RRAM), comprises:
   a bottom electrode disposed on a substrate;
   a resistive switching layer disposed over the bottom electrode, the resistive switching layer being a composite of a metal, silicon, and oxygen, the resistive switching layer being formed by a process consisting essentially of:
   oxidation of a metal silicide of the metal,
   co-deposition of the metal and silicon in oxygen ambiance,
   co-deposition of a metal oxide of the metal and silicon, or
   co-deposition of a metal oxide of the metal and silicon oxide;
   a top electrode disposed over the resistive switching layer; and
   a continuous tunnel barrier layer disposed under the top electrode and over the bottom electrode, wherein at least one of the bottom electrode and the top electrode comprises a plurality of sub-layers, each sub-layer having a substantially uniform thickness in one dimension in a cross-sectional view, and wherein at least two sub-layers comprise a metal material.

2. The RRAM of claim 1, wherein the bottom electrode comprises a material, selected from a group consisting essentially of TaN, TiN, TiAlN, TiW, Pt, W, Ru, and combinations thereof.

3. The RRAM of claim 1, wherein a thickness of the bottom electrode is between a range about 5-500 nm.

4. The RRAM of claim 1, wherein a thickness of the resistive switching layer is between a range about 1-100 nm.

5. The RRAM of claim 1, wherein the top electrode comprises a material, selected from a group consisting essentially of TaN, TiN, TiAlN, TiW, Pt, W, Ru, and combinations thereof.

6. The RRAM of claim 1, wherein a thickness of the top electrode is between a range about 5-500 nm.

7. The RRAM of claim 1, wherein the substrate comprises a complementary metal oxide semiconductor (CMOS) circuit, an isolation structure, a diode, or a capacitor.

8. The RRAM of claim 1, wherein the metal of the resistive switching layer comprises a singular or a plural combination of W, Ta, Ti, Ni, Co, Hf, Ru, Zr, Zn, Fe, Sn, Al, Cu, Ag, Mo, or Cr.

9. The RRAM of claim 1, further comprising:
a continuous tunnel barrier layer of insulating material disposed in direct contact with the resistive switching layer between the top electrode or the bottom electrode, wherein the insulating material comprises a material selected from a group consisting essentially of $Al_2O_3$, $SiO_2$, MgO, $TiO_2$, TiAlON, $TaO_2$, TaAlON, SiN, SiON, or combinations thereof.

10. The RRAM of claim 1, wherein the resistive switching layer is formed by co-deposition of metal and silicon in oxygen ambiance.

11. A resistive random access memory (RRAM), comprises:
a bottom electrode disposed on a substrate;
a resistive switching layer disposed on the bottom electrode, the resistive switching layer comprising a composite of tungsten, silicon, and oxygen and formed by a process consisting essentially of:
oxidation of tungsten silicide,
co-deposition of tungsten and silicon in oxygen ambiance,
co-deposition of tungsten oxide and silicon, or
co-deposition of tungsten oxide and silicon oxide;
a top electrode disposed on the resistive switching layer; and
a tunnel barrier layer between the bottom electrode and the top electrode, wherein at least one of the bottom electrode and the top electrode comprises two sub-layers, each sub-layer having a planar top and bottom in a cross-sectional view, and wherein the two sub-layers comprise different metal materials.

12. The RRAM of claim 11, wherein the metal materials of the two sub-layers are selected from a group consisting essentially of TaN, TiN, TiAlN, TiW, Pt, W, Ru, or combinations thereof.

13. The RRAM of claim 11, wherein the tunnel barrier layer comprises a material selected from a group consisting essentially of $Al_2O_3$, $SiO_2$, MgO, $TiO_2$, TiAlON, $TaO_2$, TaAlON, SiN, SiON, or combinations thereof.

14. The RRAM of claim 11, wherein the resistive switching layer is formed by co-deposition of metal oxide and silicon or silicon oxide.

15. A resistive random access memory (RRAM), comprising:
a substrate comprising a complementary metal oxide semiconductor (CMOS) circuit, an isolation structure, a diode, or a capacitor;
a top electrode layer comprising first and second sub-layers of different metal materials, each of the first and second sub-layers respectively having a substantially uniform thickness in a first dimension in cross-sectional view and electrically interfacing to each other in a second dimension perpendicular to the first dimension;
a bottom electrode layer disposed in contact with the substrate in the second dimension and electrically connected to a drain electrode of a transistor, the bottom electrode layer comprising third and fourth sub-layers of different metal materials, each of the third and fourth sub-layers respectively having a substantially uniform thickness in the first dimension and electrically interfacing to each other in the second dimension, the different metal materials of the top and bottom electrode layers selected from a group consisting essentially of TaN, TiN, TiAlN, TiW, Pt, W, Ru, or combinations thereof;
a resistive switching layer disposed between the top electrode layer and bottom electrode layer and electrically connected to the top or bottom electrode layer, material of the resistive switching layer being a metal, silicon, and oxygen as an oxide, wherein the metal of the resistive switching layer comprises a singular or a plural combination of W, Ta, Ti, Ni, Co, Hf, Ru, Zr, Zn, Fe, Sn, Al, Cu, Ag, Mo, or Cr, wherein the resistive switching layer is formed by a process consisting essentially of:
oxidation of a metal silicide of the metal,
co-deposition of the metal and silicon in oxygen ambiance,
co-deposition of a metal oxide of the metal and silicon, or
co-deposition of a metal oxide of the metal and silicon oxide; and
a tunnel barrier layer of insulating material disposed between the resistive switching layer and the top electrode layer or the bottom electrode layer.

16. The RRAM of claim 15, wherein a thickness of the bottom electrode is between a range about 5-500 nm.

17. The RRAM of claim 16, wherein a thickness of the resistive switching layer is between a range about 1-100 nm.

18. The RRAM of claim 17, wherein a thickness of the top electrode layer is between a range about 5-500 nm.

19. The RRAM of claim 18, wherein a thickness of the tunnel barrier layer is between a range about 0.5-50 nm.

20. The RRAM of claim 19, wherein the metal of the resistive switching layer is tungsten.

* * * * *